US009099537B2

(12) United States Patent
Babich et al.

(10) Patent No.: US 9,099,537 B2
(45) Date of Patent: Aug. 4, 2015

(54) SELECTIVE NANOTUBE GROWTH INSIDE VIAS USING AN ION BEAM

(75) Inventors: Katherina E. Babich, Chappaqua, NY (US); Alessandro C. Callegari, Yorktown Heights, NY (US); John J. Connolly, Ossining, NY (US); Eugene J. O'Sullivan, Nyack, NY (US)

(73) Assignee: International Business Machines Corporation, Armonk, NY (US)

(*) Notice: Subject to any disclaimer, the term of this patent is extended or adjusted under 35 U.S.C. 154(b) by 1309 days.

(21) Appl. No.: 12/549,929

(22) Filed: Aug. 28, 2009

(65) Prior Publication Data

US 2011/0048930 A1   Mar. 3, 2011

(51) Int. Cl.
*C23C 14/14* (2006.01)
*H01L 21/768* (2006.01)
*H01J 37/305* (2006.01)
*H01J 37/304* (2006.01)
*H01L 23/532* (2006.01)

(52) U.S. Cl.
CPC ......... *H01L 21/76879* (2013.01); *H01J 37/305* (2013.01); *H01J 37/3045* (2013.01); *H01J 37/3056* (2013.01); *H01L 23/53276* (2013.01); *H01L 2221/1094* (2013.01); *H01L 2924/0002* (2013.01)

(58) Field of Classification Search
CPC ............... H01J 2237/1506; H01J 37/3056; H01J 37/3045; H01J 37/305
USPC ....................................... 204/192.34, 192.35
See application file for complete search history.

(56) References Cited

U.S. PATENT DOCUMENTS

| 7,015,500 | B2 | 3/2006 | Choi et al. | |
|---|---|---|---|---|
| 7,247,897 | B2 | 7/2007 | Choi et al. | |
| 7,265,376 | B2 | 9/2007 | Graham et al. | |
| 7,368,823 | B1 | 5/2008 | Horibe et al. | |
| 2004/0182600 | A1 | 9/2004 | Kawabata et al. | |
| 2004/0222082 | A1* | 11/2004 | Gopalraja et al. | 204/192.3 |
| 2004/0251551 | A1 | 12/2004 | Hideki | |
| 2005/0233263 | A1* | 10/2005 | Park et al. | 430/324 |
| 2006/0040485 | A1* | 2/2006 | Lee et al. | 438/597 |
| 2006/0091557 | A1 | 5/2006 | Sakamoto et al. | |
| 2006/0125109 | A1 | 6/2006 | Kirby et al. | |
| 2006/0263289 | A1 | 11/2006 | Heo et al. | |
| 2007/0123028 | A1 | 5/2007 | Furukawa et al. | |
| 2007/0148963 | A1 | 6/2007 | Chan et al. | |
| 2008/0182408 | A1 | 7/2008 | Lee et al. | |
| 2008/0237858 | A1 | 10/2008 | Nihei | |
| 2008/0246149 | A1 | 10/2008 | Kwak et al. | |
| 2008/0317947 | A1 | 12/2008 | Coiffic | |
| 2008/0317970 | A1 | 12/2008 | Coiffic et al. | |
| 2009/0200536 | A1 | 8/2009 | Van Schaijk et al. | |
| 2009/0266590 | A1 | 10/2009 | Aoi | |

FOREIGN PATENT DOCUMENTS

| CN | 1738022 A | 2/2006 |
|---|---|---|
| CN | 101010793 A | 8/2007 |

(Continued)

*Primary Examiner* — Jason M Berman
(74) *Attorney, Agent, or Firm* — Cantor Colburn LLP; Vazken Alexanian (57) ABSTRACT

A method of selectively growing one or more carbon nanotubes includes forming an insulating layer on a substrate, the insulating layer having a top surface; forming a via in the insulating layer; forming an active metal layer over the insulating layer, including sidewall and bottom surfaces of the via; and removing the active metal layer at portions of the top surface with an ion beam to enable the selective growth of one or more carbon nano-tubes inside the via.

20 Claims, 8 Drawing Sheets (56) References Cited

FOREIGN PATENT DOCUMENTS

| DE | 10250834 A1 | 5/2004 |
| JP | 05055167 | 3/1993 |
| JP | 2005109465 A | 4/2005 |
| JP | 2008041954 A | 2/2008 |
| JP | 2008258184 A | 10/2008 |
| WO | 2006003620 A1 | 1/2006 |
| WO | 2009060556 A1 | 5/2009 |

* cited by examiner

SELECTIVE NANOTUBE GROWTH INSIDE VIAS USING AN ION BEAM

BACKGROUND

Application of carbon nano-tubes to the interconnects of a large scale integrated circuit (LSI) is taken as an example of their application to electronics. Carbon nano-tubes range from a few to tens of nanometers (nm) in diameter, and are as long as a few nanometers in length. Because of their one-dimensional electronic properties due to this shape anisotropy, the carbon nano-tube characteristically has a maximum current density allowing the flowing of current without disconnection of about 1,000,000 amperes (A) per square centimeter, which is 100 times or more as high as that of a copper interconnect. Further, with respect to heat conduction, the carbon nano-tube is ten times as high in conductivity as copper. In terms of electric resistance, it has been reported that transportation without scattering due to impurities or lattice vibration (phonon), or so-called "ballistic electron transportation," can be realized with respect to electrons flowing through the carbon nano-tube. It is known that resistance per carbon nano-tube in this case is about 6.45 k$\Omega$. The carbon nano-tube ranges widely from about 0.4 to about 100 nm in diameter, and its diameter is formed in a self-organizing manner. Therefore, the carbon nano-tube is characterized by an extremely limited fluctuation along its length. Because of these characteristics, a highly reliable, extremely fine metal interconnect with less migration, which is a failure mode due to high current densities, is expected to be realized in the case of applying the carbon nano-tube to an LSI interconnect.

Well-known methods of growing a carbon nano-tube include arc discharge, laser ablation (laser vaporization), chemical vapor deposition (CVD), and silicon carbide (SiC) sublimation. According to these methods, transition metal is known to be employed as catalyst metal in forming a carbon nano-tube. According to CVD and SiC sublimation, a catalyst metal layer is formed, and patterning is performed on the catalyst metal layer using lithography or etching employed in semiconductor LSI. Thereby, the position of growth of the carbon nano-tubes can be controlled through these various methods.

However, selective growth of carbon nano-tubes in oxide vias still presents fabrication problems. For example, carbon nano-tubes, need a seed layer consisting of very thin metals or metal alloys to nucleate. This thin metal layer deposits both on the vias as well as on the oxide preventing selective growth of the nano-tube in the vias. Usually a process of patterning the seed layer or catalyst metal layer is additionally required, which is a disadvantage in terms of production cost and the reliability of a semiconductor. Other methods/processes used involve a two-mask lithography level to prevent forming a seed layer over the oxide, which can also be costly and lengthen the fabrication process. This two-mask process can also lead to unreliable semiconductors.

SUMMARY

According to one embodiment of the present invention, a method of selectively growing one or more carbon nano-tubes is provided. The method comprises: forming an insulating layer on a substrate, the insulating layer having a top surface; forming a via in the insulating layer; forming an active metal layer over the insulating layer, including sidewall and bottom surfaces of the via; and removing the active metal layer at portions of the top surface with an ion beam to enable the selective growth of one or more carbon nano-tubes inside the via.

According to another embodiment of the present invention, a method of selectively growing carbon nano-tubes is provided. The method comprises: forming an insulating layer on a substrate, the insulating layer having a top surface; forming a via in the insulating layer; forming an active metal layer over the insulating layer; removing the active metal layer at portions of the top surface with a first ion beam tuned at a shallow angle in order to prevent the removal of the active layer at a bottom portion of the via; and applying a carbon-containing gas to the via to form one or more carbon nano-tubes.

According to yet another embodiment of the present invention, a method of selectively growing carbon nano-tubes is provided. The method comprises: forming an insulating layer on a substrate, the insulating layer having a top surface; forming a via in the insulating layer; forming an active metal layer over the insulating layer, including sidewall and bottom surfaces of the via; removing the active metal layer at portions of the top surface with a first ion beam tuned at a shallow angle in order to prevent the removal of the active layer at a bottom portion of the via; applying a carbon-containing gas to the via; and applying a second ion beam at a steep angle to the active metal inside the via enabling selective growth of a single carbon nano-tube inside the via.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments are directed to a method of selectively growing one or more carbon nano-tubes inside a via. In one exemplary embodiment, the method includes using an ion beam tuned at a shallow angle to enable selective growth of carbon nano-tubes inside the via. In accordance with one embodiment, the ion beam operates at energy levels ranging from about 100 electron volts (eV) to about 400 eV. In another exemplary embodiment, the method includes using another ion beam tuned at a steep angle to selectively grow a single carbon nano-tube inside the via. Exemplary embodiments are also directed to a semiconductor device fabricated or manufactured using these exemplary methods of selectively growing one or more carbon nano-tubes inside a via.

Figure 1:
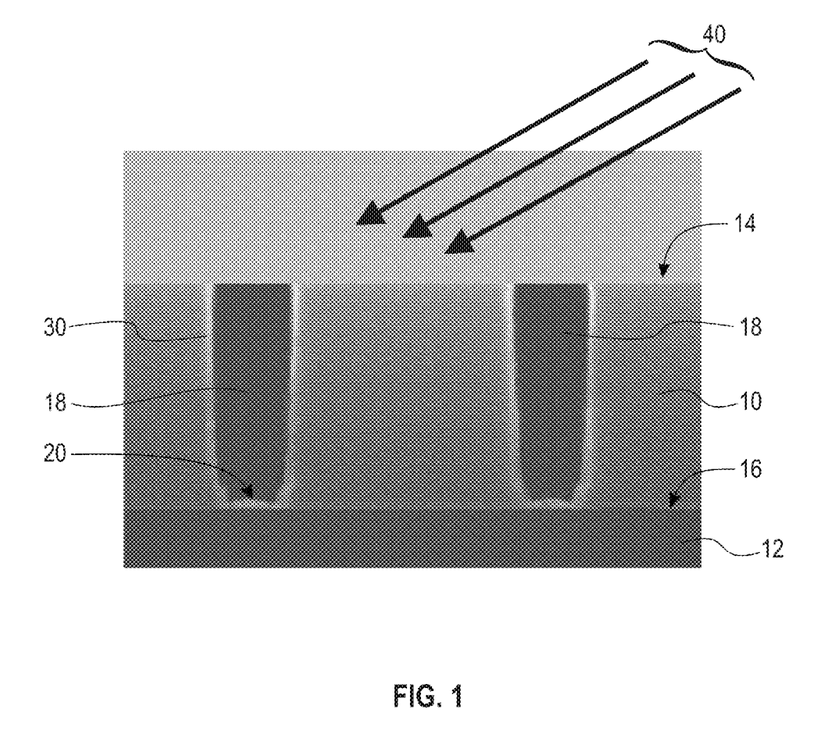
FIGS. 1-2 are cross-sectional views for illustrating a method of selectively growing carbon nano-tubes in a via in accordance with one exemplary embodiment of the present invention.
Figure 2:
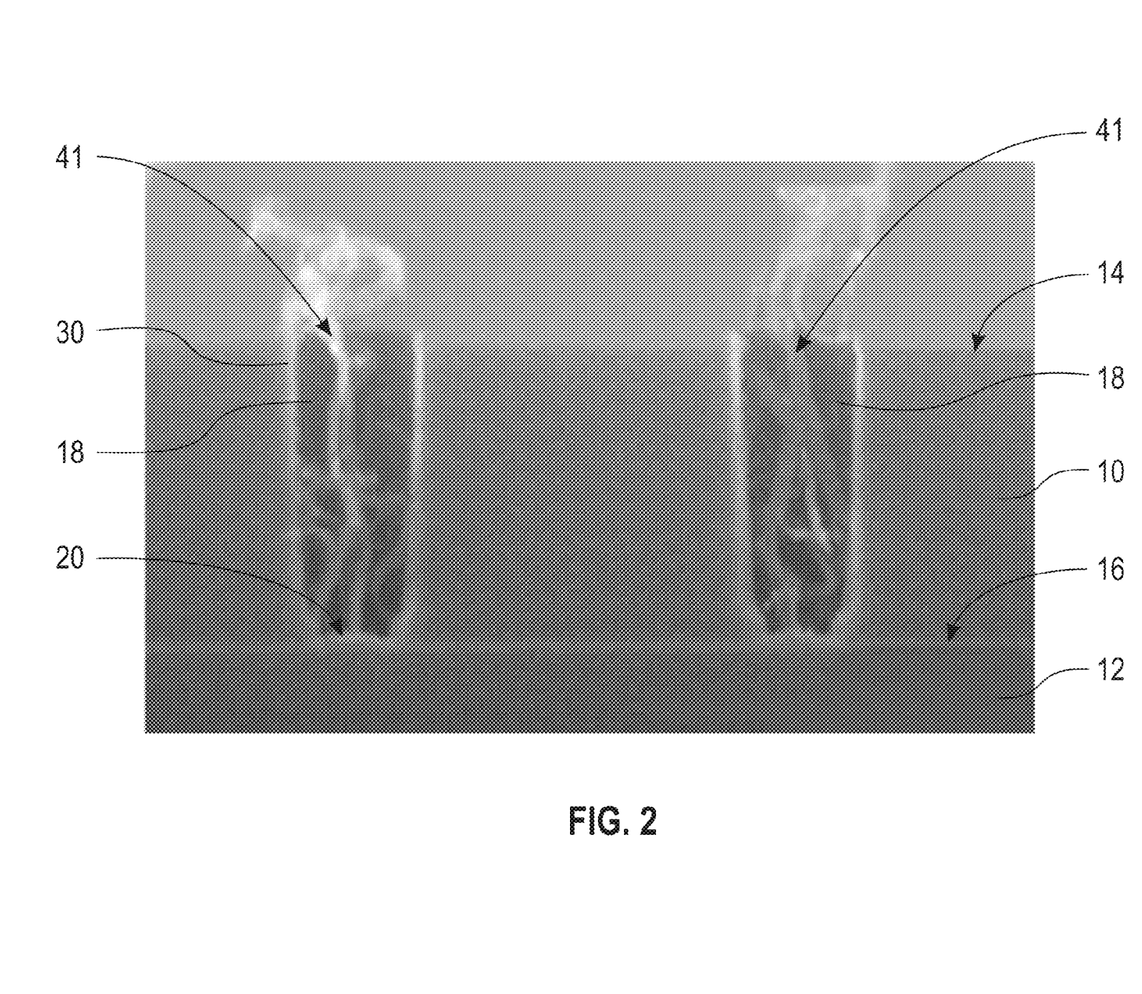

Now referring to the drawings, FIGS. 1-2 are cross-sectional views illustrating methods of selectively growing carbon nano-tubes in accordance with exemplary embodiments of the present invention. The carbon nano-tube formation methods described herein can be applied to the fabrication process of various types of semiconducting devices (e.g., transistors), semiconducting memory devices (e.g., Dynamic Random Access Memory) and other integrated circuits.

Referring to FIG. 1, an insulating layer 10 is formed on a substrate 12. The substrate 12 can be any material upon which semiconductor devices are fabricated. For example, substrate 12 can be a wafer, which is typically used in the fabrication of integrated circuits and other nano-devices. Various other structures (not shown) can also be formed on the substrate such as, for example, a transistor, a contact pad of a capacitor that is electrically connected to a contact region of a transistor, a bit line that is electrically connected to a contact region of a transistor, a capacitor, etc. Further, other layers (not shown), such as for example, a silicide layer or a cobalt silicide layer can be formed over the substrate, such as, for example, between the active layer and the substrate. For simplistic purposes, only the basic layers in forming an integrated circuit are shown.

The insulating layer 10 has a top surface 14 and a bottom surface 16 defining a thickness, which can vary depending on the application. One or more vias or openings 18 are formed in the insulating layer 10 at a length along the insulating layer 10. For ease of discussion, however, only two vias are illustrated in FIGS. 1-2. Each via allows conductive connection between different layers/components of the semiconductor. Each via is defined by sidewalls and bottom surfaces as shown. The vias 18 are formed in the insulating layer 10 through a reactive ion etching (RIE) process in accordance with one exemplary embodiment. Of course, the vias 18 can be formed in the insulating layer 10 by drilling the insulating layer 10 or by using conventional semiconductor fabrication processes. The depth and the size of the vias 18 can vary depending on the application. The vias 18 are formed such that a bottom portion 20 of the vias 18 is exposed from the top surface 14.

In accordance with exemplary embodiments of the present invention, the insulating layer 10 may be formed from any suitable insulating material, such as, for example, silicon oxide, silicon nitrate, boron-doped oxide, dielectric oxide, etc. The insulating layer may also include phosphor silicate glass (PSG), boro-phosphorous silicate glass (BPSG), undoped silica glass (USG), spin-on-glass (SOG), etetra-ethyl-ortho-silicate (TEOS), etc. The insulating layer 10 may be formed, for example, by a chemical vapor deposition (CVD) process, a plasma-enhanced CVD (PECVD) process, a high density CVD (HDCVD) process, spin coating process, etc.

An active metal layer 30 is formed over the insulating layer 10. More specifically, the active metal layer 30 is formed over the top surface 14 of the insulating layer 10 including sidewall and bottom surfaces of the vias 18. The active metal layer 30 is a metal catalyst layer that serves as a nucleus of growth for carbon nano-tubes. The active metal layer 30 is formed of one or more metals or metal alloys, such as, cobalt, nickel, iron, palladium, titanium, etc. Of course, other suitable metals or metal alloys may be used in other exemplary embodiments. The active metal layer 30 can have multiple dimensions depending on the application. For instance, the active metal layer 30 can be a single layer or multi-layer catalyst comprising of one or more metals or metal alloys. A thermal CVD process or a physical vapor deposition (PVD) process (e.g., sputtering, evaporation, etc.) can be used to form the active metal layer 30 over the insulating layer 10 in accordance with one embodiment. Of course, other processes can be used and should not be limited to the examples described herein.

In accordance with one exemplary embodiment, the active metal layer 30 at portions of the top surface 14 of the insulating layer 10 is removed with an ion beam, which is generally indicated by arrows 40 in FIG. 1, to enable selective growth of carbon nano-tubes inside the vias 18. The ion beam can be generated from an ion beam source (not shown) using an ion beam process. The ion beam 40 is configured to selectively remove the active metal layer from portions of the top surface 14 of the insulating layer 10 while leaving the active metal layer at the bottom portion 20 of the vias 18 untouched by the ion beam 40. This allows for selective growth of carbon nano-tubes, specifically inside the vias. The ion beam 40 is turned at a shallow angle during the removal of the active metal layer 30 at portions of the top surface in order to prevent the removal of the active metal layer 30 inside the vias 18, particularly the bottom portion 20 of the vias 18. Thus, as the ion beam 40 is swept across the length of the substrate, only the active metal layer 30 at portions of the top surface 14 is removed while the active metal layer 30 at the bottom portion 20 of the vias 18 remains intact. As such, carbon nano-tubes are prevented from growing on portions of the top surface of the insulating layer between the vias 18, which may be undesirable in some applications.

In accordance with one non-limiting exemplary embodiment, the ion beam is tuned at a shallow angle (with respect to the substrate surface) in a range of about −1 degrees to about −45 degrees depending on the direction of removal. For example, the ion beam can be tuned at a +45 degrees angle when the substrate 12 is being swept from right to left. It should be understood that the angle of the ion beam 40 can be greater than −45 degrees depending on the setup conditions. In one embodiment, the ion beam 40 is operating at a high-energy level during the removal process. In one non-limiting embodiment, the ion beam is operating from about 100 electron-volts (eV) to about 400 eV. The energy level and ion beam angle can each be varied depending on the application and should not be limited to the examples described herein. For example, an energy level of a higher degree may be required for a thick catalyst layer as opposed to a thinner catalyst layer for complete removal. Further, the time period of sweeping the ion beam across the substrate can vary depending on the size and thickness of the catalyst layer.

In accordance with one exemplary embodiment, one or more carbon nano-tubes, which are generally indicated by arrow 41 in FIG. 2, are formed inside the vias 18 by applying a carbon-containing gas (e.g., ethylene) to the vias 18 in a reactor (not shown). In one exemplary embodiment, the carbon-containing gas is applied to the vias through a thermal CVD process under a reactor pressure ranging from about 100 Torr to about 300 Torr. In another exemplary embodiment, the carbon-containing gas is applied to the vias through a PECVD process under a reactor pressure ranging from about 4 Torr to 8 Torr. It should be understood that the reactor pressure may vary depending on the process being used.

Figure 3:
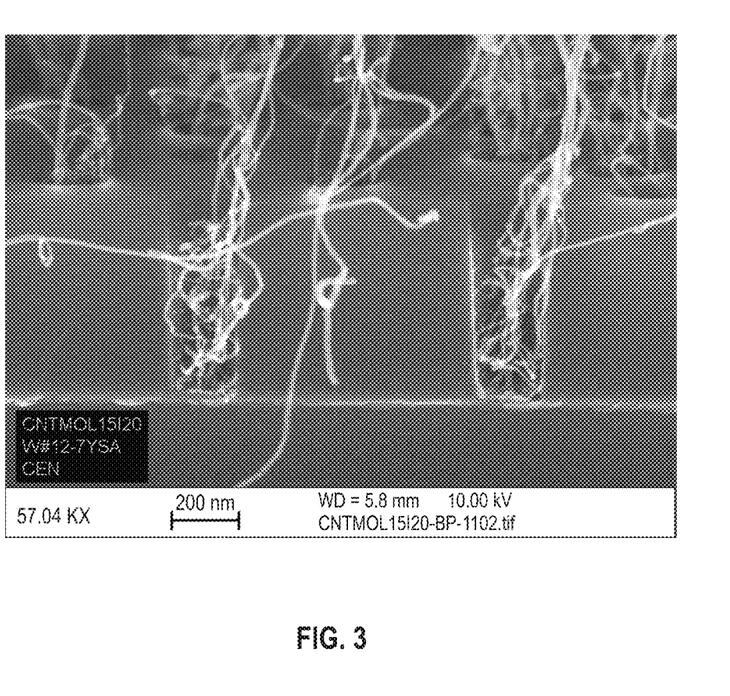
FIG. 3 is an exemplary image of one or more carbon nano-tubes grown inside vias taken during an actual experiment in accordance with one exemplary embodiment of the present invention.

One or more carbon nano-tubes can be formed at a temperature of about 500° C. to 800° C. depending on the set up conditions. In accordance with one embodiment, the substrate 12 is heated at a temperature ranging from about 500° C. to 800° C. to enable selective growth of carbon nano-tubes inside the vias. In operation, once the active metal layer 30 is removed from portions of the top surface 14 of the insulating layer 10, a process gas, such as, carbon-containing gas is supplied to the vias 18 saturating the active metal layer 30 on the bottom portion 20 of the vias 18 with carbon atoms. The high-temperature reaction of the carbon-containing gas saturating the active metal layer 30 on the bottom portion 20 of the vias 18 at elevated temperatures causes the growth of carbon nano-tubes from the bottom portion 20 of the vias 18. The carbon nano-tubes can serve as highly reliable and conductive wires for various semiconductor applications. FIG. 3 illustrates an exemplary image of one or more carbon nano-tubes grown inside vias taken during an actual experiment in accordance with one exemplary embodiment.

Figure 4:
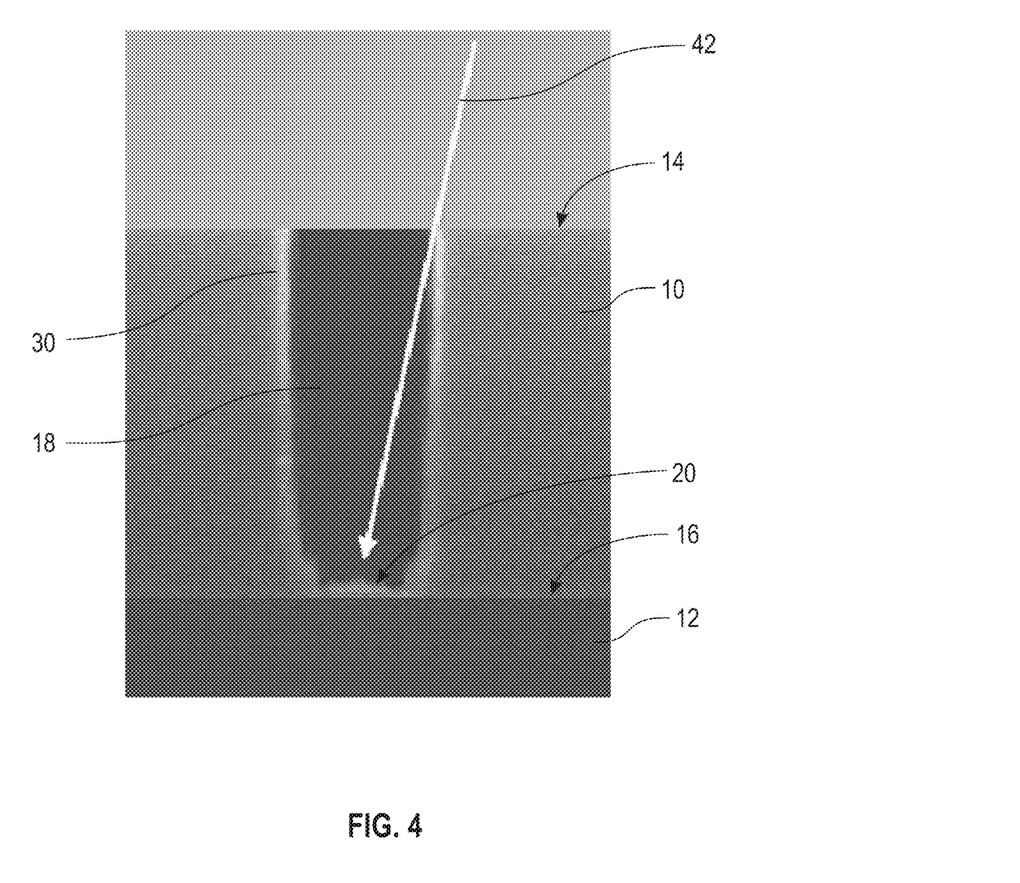
FIG. 4 is a cross-sectional view illustrating a method of selectively growing a single carbon nano-tube inside a via in accordance with one exemplary embodiment of the present invention.
Figure 5:
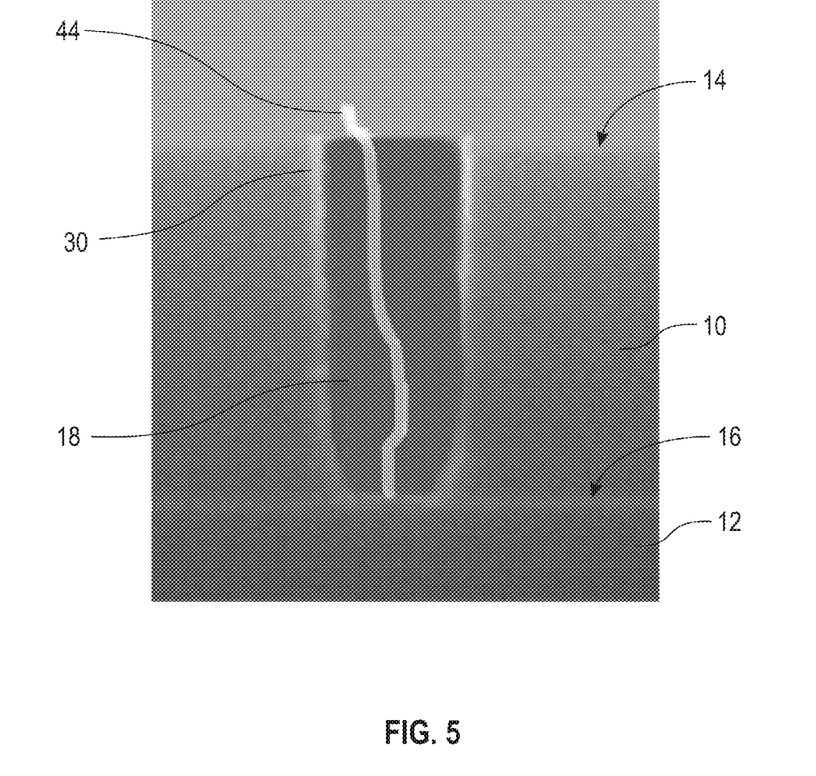
FIG. 5 is a cross-sectional view illustrating the single carbon nano-tube grown inside the via in accordance with one exemplary embodiment of the present invention.
Figure 6:
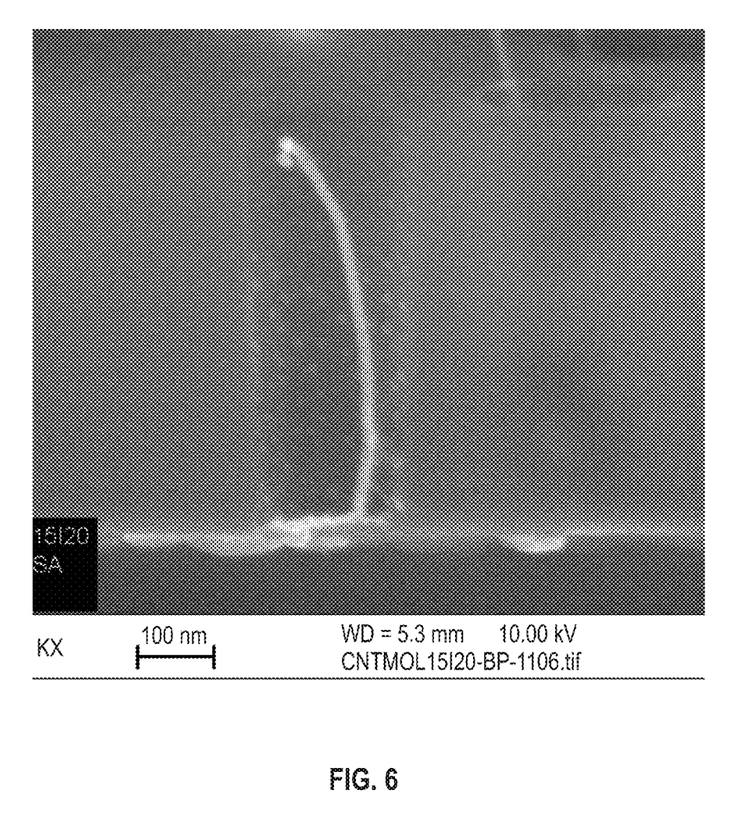
FIG. 6 is an exemplary image of a single carbon nano-tube grown inside a via taken during an actual experiment in accordance with one exemplary embodiment of the present invention.
Figure 7:
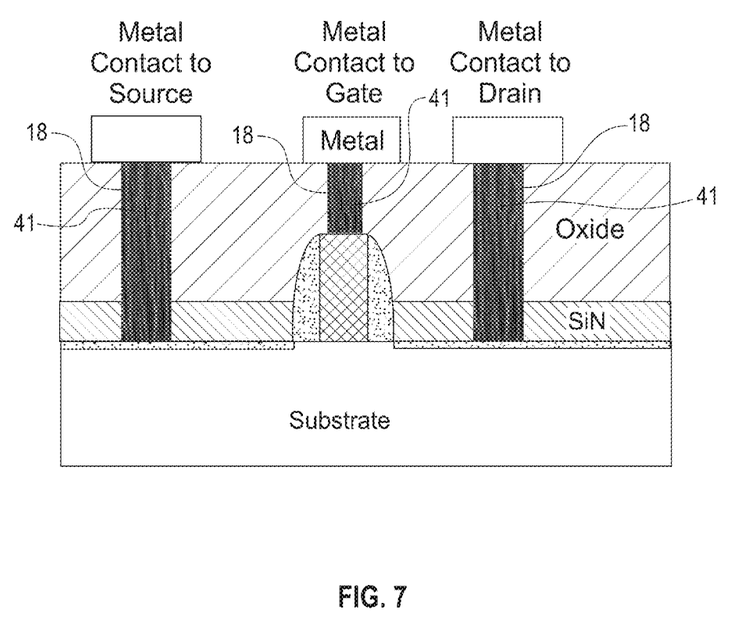
FIG. 7 is a flow diagram that illustrates a method of selectively growing carbon nano-tubes inside a via in accordance with one exemplary embodiment of the present invention.

In accordance with one exemplary embodiment, via 18 is bombarded with another ion beam, which is generally indicated by arrows 42 in FIG. 4, to partially remove or modify the active metal layer 30 at the bottom portion 20 of the via 18 to enable single carbon nano-tube growth as shown in FIG. 5. As illustrated in FIG. 4, a single carbon nano-tube 44 is grown from modifying the active metal layer 30 at the bottom portion 20 of the via 18 using ion beam 42. In this embodiment, the ion beam 42 is tuned at a steep angle (close to 90 degrees) directing the ion beam 42 only to the active metal layer at the bottom portion of the via 18. In one embodiment, the ion beam 42 is turned at a steep angle (with respect to the substrate surface) in a range of about −46 degrees to about −90 degrees depending on the direction of removal. In this embodiment, ion beam 42 is operating at a low-energy level in order to modify the active metal layer at the bottom portion of the via without completing removing the catalyst material. In accordance with one embodiment, ion beam 42 is operating between about 50 eV and about 100 eV. FIG. 6 illustrates an exemplary image of a single carbon nano-tube grown inside a via during an actual experiment in accordance with one exemplary embodiment. This method of selectively growing single carbon nano-tubes is attractive in back end of line (BEOL) chips or applications because of extreme scaling as shown in FIG. 7. As illustrated in FIG. 7, a structure (e.g., wiring of a transistor) can be fabricated according to the methods described herein.

Figure 8:
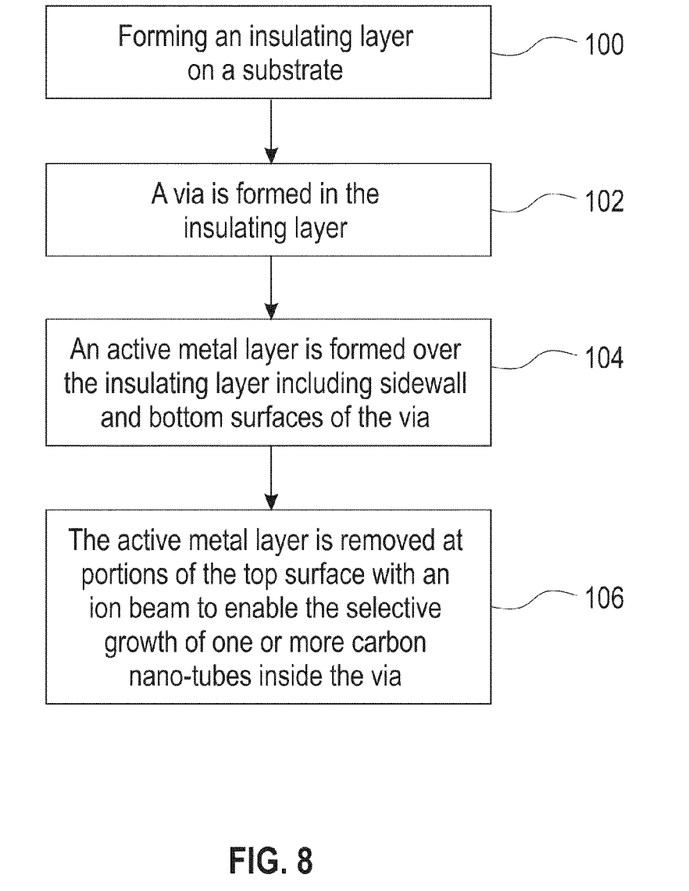
FIG. 8 is a schematic of a structure with one or more carbon nano-tubes selectively grown inside the vias in accordance with one exemplary embodiment of the present invention.

Now referring to FIG. 8, a method of selectively growing one or more carbon nano-tubes inside a via in accordance with one exemplary embodiment will now be discussed.

The method begins at block 100, by forming an insulating layer on a substrate.

At block 102, a via is formed in the insulating layer.

At block 104, an active metal layer is formed over the insulating layer, including sidewall and bottom surfaces of the via. The active metal layer can be a single or multi-layer catalyst comprising one or more metals or metal alloys in accordance with one embodiment.

At block 106, the active metal layer is removed at portions of the top surface with an ion beam to enable the selective growth of one or more carbon nano-tubes inside the via. The ion beam is tuned at a shallow angle in accordance with one embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of selectively growing one or more carbon nano-tubes, comprising:
    forming an insulating layer on a substrate, the insulating layer having a top surface;
    forming a via in the insulating layer;
    forming an active metal layer over the insulating layer, including sidewall and bottom surfaces of the via; and
    removing the active metal layer from the top surface with an ion beam, such that the active metal layer remains on bottom surfaces of the via and most of the sidewall surfaces of the via, to enable the selective growth of one or more carbon nano-tubes inside the via.

2. The method as in claim 1, further comprising forming the one or more carbon nano-tubes from the active metal layer inside the via by applying carbon-containing gas inside the via.

3. The method as in claim 1, wherein the one or more carbon nano-tubes are formed by a chemical vapor deposition (CVD) process under a pressure ranging from about 100 Torr to about 300 Torr.

4. The method as in claim 1, wherein the one or more carbon nano-tubes are formed by a plasma enhanced chemical vapor deposition (PECVD) process under a pressure ranging from about 4 Torr to 8 Torr.

5. The method as in claim 1, wherein the ion beam is tuned at a shallow angle during the removal of the active metal layer at portions of the top surface in order to prevent the removal of the active metal layer at a bottom portion of the via.

6. The method as in claim 5, wherein the shallow angle is in a range from about −1 degrees to about −4 degrees.

7. The method as in claim 1, wherein the ion beam is operating at an energy level from about 100 eV to about 400 eV.

8. The method as in claim 1, further comprising heating the substrate at a temperature from about 500° Celsius to about 800° Celsius to enable the selective growth of one or more carbon nano-tubes inside the via.

9. The method as in claim 1, further comprising applying another ion beam at a steep angle to the active metal layer inside the via so as to partially remove or modify the active metal layer at the bottom surface of the via, enabling a single carbon nano-beam to grow inside the via.

10. The method as in claim 9, wherein the steep angle is in a range from about −46 degrees to about −90 degrees.

11. A method of selectively growing carbon nano-tubes, comprising:
    forming an insulating layer on a substrate, the insulating layer having a top surface;
    forming a via in the insulating layer;
    forming an active metal layer over the insulating layer;
    removing the active metal layer from the top surface with a first ion beam tuned at a shallow angle in order to prevent the removal of the active metal layer at a bottom portion of the via, such that the active metal layer also remains on most of the sidewall surfaces of the via; and
    applying a carbon-containing gas to the via to form one or more carbon nano-tubes.

12. The method as in claim 11, further comprising applying a second ion beam at a steep angle to the active metal layer inside the via so as to partially remove or modify the active metal layer at the bottom surface of the via, enabling the selective growth of a single carbon nano-tube inside the via.

13. The method as in claim 12, wherein the steep angle is in a range from about −46 degrees to about −90 degrees.

14. The method as in claim 11, wherein the shallow angle is in a range from about −1 degrees to about −4 degrees.

15. The method as in claim 11, wherein the first ion beam is operating at an energy level from about 100 eV to about 400 eV.

16. The method as in claim 11, wherein the one or more carbon nano-tubes are formed by a chemical vapor deposition (CVD) process under a pressure ranging from about 100 Torr to about 300 Torr.

17. The method as in claim 11, wherein the one or more carbon nano-tubes are formed by a plasma enhanced chemical vapor deposition (PECVD) process under a pressure ranging from about 4 Torr to 8 Torr.

18. The method as in claim 11, further comprising heating the substrate at a temperature from about 500° Celsius to about 800° Celsius to enable the selective growth of one or more carbon nano-tubes inside the via.

19. A method of selectively growing carbon nano-tubes, comprising:
    forming an insulating layer on a substrate, the insulating layer having a top surface;
    forming a via in the insulating layer;
    forming an active metal layer over the insulating layer, including sidewall and bottom surfaces of the via;
    removing the active metal layer from the top surface with a first ion beam tuned at a shallow angle in order to prevent the removal of the active metal layer at a bottom portion of the via, such that the active metal layer also remains on most of the sidewall surfaces of the via;
    applying a carbon-containing gas to the via; and
    applying a second ion beam at a steep angle to the active metal inside the via so as to partially remove or modify the active metal layer at the bottom surface of the via, enabling selective growth of a single carbon nano-tube inside the via.

20. The method as in claim 19, wherein the steep angle is in a range from about −46 degrees to about −90 degrees and the shallow angle is in a range from about −1 degrees to about −4 degrees.

* * * * *